United States Patent
Kang

(10) Patent No.: US 7,050,321 B2
(45) Date of Patent: May 23, 2006

(54) FERAM HAVING NEW SIGNAL LINE STRUCTURE

(75) Inventor: Hee Bok Kang, Daejeon (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 7 days.

(21) Appl. No.: 10/331,572

(22) Filed: Dec. 31, 2002

(65) Prior Publication Data

US 2004/0042252 A1   Mar. 4, 2004

(30) Foreign Application Priority Data

Aug. 30, 2002  (KR) .................. 10-2002-0051935

(51) Int. Cl.
  G11C 5/06   (2006.01)
  G11C 11/22   (2006.01)
  G11C 7/02   (2006.01)
  G11C 8/00   (2006.01)

(52) U.S. Cl. ............... 365/65; 365/145; 365/191; 365/207; 365/230.03; 365/230.06

(58) Field of Classification Search .......... 365/63, 365/189.05, 189.08, 145, 65, 207
See application file for complete search history.

(56) References Cited

U.S. PATENT DOCUMENTS

| | | | | |
|---|---|---|---|---|
| 5,448,516 A | * | 9/1995 | Tsukikawa et al. | 365/182 |
| 5,499,215 A | * | 3/1996 | Hatta | 365/230.03 |
| 5,629,898 A | * | 5/1997 | Idei et al. | 365/222 |
| 5,930,195 A | * | 7/1999 | Komatsu | 365/230.03 |
| 5,953,261 A | * | 9/1999 | Furutani et al. | 365/189.05 |
| 5,970,003 A | * | 10/1999 | Miyatake et al. | 365/200 |
| RE36,490 E | * | 1/2000 | Hwang et al. | 365/226 |
| 6,064,621 A | * | 5/2000 | Tanizaki et al. | 365/230.03 |
| 6,094,382 A | * | 7/2000 | Choi et al. | 365/200 |
| 6,108,264 A | * | 8/2000 | Takahashi et al. | 365/230.03 |
| 6,147,925 A | * | 11/2000 | Tomishima et al. | 365/230.03 |
| 6,150,728 A | * | 11/2000 | Tsukude et al. | 257/786 |
| 6,154,399 A | * | 11/2000 | Ogishima | 365/200 |
| 6,310,815 B1 | * | 10/2001 | Yamagata et al. | 365/230.03 |
| 6,317,355 B1 | | 11/2001 | Kang | |
| 6,363,451 B1 | * | 3/2002 | Kim | 710/305 |
| 6,621,744 B1 | * | 9/2003 | Kojima | 365/185.23 |

(Continued)

FOREIGN PATENT DOCUMENTS

KR   2001-27117   4/2001

(Continued)

Primary Examiner—Amir Zarabian
Assistant Examiner—Ly Duy Pham
(74) Attorney, Agent, or Firm—Jacobson Holman PLLC

(57) ABSTRACT

The nonvolatile ferroelectric memory device having a cell array structure including sub-bitlines and main bitlines wherein a sensing voltage of sub-bitlines is transformed into a current to induce a sensing voltage of main bitlines, comprising: a plurality of cell array blocks comprising the cell array; a cell array block driver for transmitting driving signals which drive the cell array blocks into the cell array blocks; a control circuit unit for symmetrically dividing the cell array blocks and controlling data to be written in or read from the cell array blocks; and a plurality of data buses shared in the main bitlines by using switching devices and arranged vertically in both sides of the control circuit unit, wherein a layer where the driving signals lines for transmitting the driving signals into the cell array blocks are formed is positioned above a layer where the cell arrays are formed. The multi-layer structure can reduce the layout area of chips because the repeated used driving signal lines are formed above the cell arrays.

16 Claims, 15 Drawing Sheets

U.S. PATENT DOCUMENTS

| | | | |
|---|---|---|---|
| 6,636,110 B1 * | 10/2003 | Ooishi et al. | 327/565 |
| 6,714,433 B1 * | 3/2004 | Doblar et al. | 365/63 |
| 2002/0149990 A1 * | 10/2002 | Lee | 365/230.03 |
| 2002/0167853 A1 * | 11/2002 | Kojima | 365/202 |
| 2003/0031058 A1 * | 2/2003 | Kajigaya et al. | 365/189.09 |
| 2004/0047229 A1 * | 3/2004 | Fujisawa et al. | 365/232 |
| 2004/0062134 A1 * | 4/2004 | Kato et al. | 365/232 |
| 2004/0140485 A1 * | 7/2004 | Matsuzaki et al. | 257/208 |

FOREIGN PATENT DOCUMENTS

KR  2001-27713  4/2001

* cited by examiner

FERAM HAVING NEW SIGNAL LINE STRUCTURE

BACKGROUND OF THE INVENTION

1. Field of the Invention

The present invention generally relates to nonvolatile ferroelectric memory device, and more particularly, to a nonvolatile ferroelectric memory device having a new signal line arrangement structure. The present invention effectively arranges signal lines for driving cell arrays to reduce delay of signals, and forms the signal lines of drivers above the cell array layer to decrease layout area of chip.

2. Description of the Background Art

Generally, a ferroelectric random access memory (hereinafter, referred to as 'FeRAM') has attracted considerable attention as next generation memory device because it has the same data processing speed as a DRAM and conserves data even after the power is turned off.

The FeRAM includes capacitors similar to the DRAM, but the capacitors are made of a ferroelectric substance. The ferroelectric substance has the characteristic of a high residual polarization that data is not removed even after eliminating an electric field applied thereto.

FIG. 1 is a characteristic curve illustrating a hysteresis loop of a general ferroelectric substance.

As shown in FIG. 1, a polarization induced by an electric field remains at a certain portion ('d' or 'a' state) due to existence of the residual (or spontaneous) polarization even after the electric field is cleared.

For using the ferroelectric substance, these 'd' and 'a' states may be matched to binary values of '1' and '0'.

FIG. 2 is a structural diagram illustrating a unit cell of the FRAM device.

As shown in FIG. 2, the unit cell of the conventional FRAM is provided with a bitline B/L arranged in one direction and a wordline W/L arranged in another direction vertical to the bitline B/L. A plateline P/L is arranged parallel to the wordline and spaced at a predetermined interval. The unit cell is also provided with a NMOS transistor having a gate connected to an adjacent wordline W/L and a source connected to an adjacent bitline B/L, and a ferroelectric capacitor FC1 connected between the drain terminal of the transistor T1 and the plateline P/L.

The data input/output operation of the conventional FRAM is now described as follows.

FIGS. 3a is a timing diagram illustrating a write mode of the FRAM while FIG. 3b is a timing diagram illustrating a read mode of the FRAM.

Referring to FIG. 3a, when an externally applied chip enable signal CSBPAD and a write enable signal WEBPAD transits from a high level to a low level, the array is enabled to start a write mode.

Thereafter, when an address is decoded in a write mode, a corresponding wordline transits from the low level to the high level, thereby selecting the cell.

During the wordline W/L maintains the high level, a 'high' signal of a predetermined interval and a 'low' signal of a predetermined interval are applied to the plateline P/L. In order to write binary logic values '1' or '0' in the selected cell, 'high' or 'low' signals synchronized to the write enable signal WEBPAD are applied to a corresponding bitline B/L.

As shown in the following Table 1, during a 'high' signal is applied to the wordline W/L, if a 'high' signal is applied to the bitline B/L and a 'low' signal is applied to the plateline P/L, a logic value '1' is written in the ferroelectric capacitor FC1. If the 'low' signal is applied to the bitline B/L and the 'high' signal is applied to the plateline P/L, a logic value '0' is written in the ferroelectric capacitor FC1.

TABLE 1

|  |  | P/L | |
|---|---|---|---|
|  | W/L: H | H | L |
| B/L | H | X | 1 |
|  | L | 0 | X |

Referring to FIG. 3B, If the externally applied chip enable signal CSBPAD is activated from the high level to the low level, all of the bitlines become equipotential to the low level by an equalizer signal before the corresponding wordline is selected.

Then, each bitline becomes inactive. A corresponding wordline according to the decoded address transits from the low level to the high level to select a cell.

The 'high' signal is applied to the plateline of the selected cell, to destroy a data Qs corresponding to a logic value '1' stored in the ferroelectric memory cell. If a logic value '0' is stored in the ferroelectric memory cell, its corresponding data Qns is not destroyed.

The destroyed data or the non-destroyed data are outputted to bitlines according to the above-described hysteresis loop characteristics, so that a sense amplifier can sense logic values '1' or '0'.

AS shown in the hysteresis loop of FIG. 1, the state moves from 'd' to 'f' when the data is destroyed, while the state moves from 'a' to 'f' when the data is not destroyed.

As a result, if the sense amplifier is enabled after a set time has elapsed, the logic value '1' is output in case the data is destroyed, while the logic value '0' is output in case the data is not destroyed.

After the sense amplifier amplifies the data, the data should be recovered into the original data.

Accordingly, the plateline P/L becomes inactive and the corresponding wordline W/L is active, to recover the data.

In order to embody high integration of memory using the above-described FeRAM, it is important to effectively arrange cell arrays, peripheral controls and relevant circuits.

In general, the same control blocks are repeatedly used for controlling the cell arrays. The repeated use of the control blocks causes a problem in layout of chips for high integration.

SUMMARY OF THE INVENTION

Accordingly, it is an object of the present invention to effectively arrange cell arrays and core-related circuits of a FeRAM. The present invention has another object of reducing the area occupied by repeatedly used control blocks.

A nonvolatile ferroelectric memory device of the present invention includes a plurality of cell array blocks each comprising a plurality of cell arrays for storing data; and a cell array block driver for outputting driving signals to read/write data from/to the cell array blocks; wherein driving signal line on which the driving signals are transferred is formed on a layer different from that of the plurality of the cell arrays.

In order to achieve the above-described object, there is provided a nonvolatile ferroelectric memory device having a cell array structure including sub-bitlines and main bitlines wherein a sensing voltage of sub-bitlines is transformed into a current to induce a sensing voltage of main bitlines, comprising: a plurality of cell array blocks each comprising a plurality of the cell arrays for storing data; a cell array block driver for transmitting driving signals to read/write data from/to the cell array blocks wherein the cell array block driver is arranged in one side of the plurality of cell array blocks; a control circuit unit for and controlling data read/write operation of the cell array blocks wherein the control circuit unit is arranged to symmetrically divide the plurality of cell array blocks; and a plurality of data buses shared by the plurality of cell array blocks wherein the plurality of data buses arranged vertically in both sides of the control circuit unit.

DETAILED DESCRIPTION OF THE PREFERRED EMBODIMENTS

The present invention will be described in more detail referring to the accompanying drawings.

Figure 1:
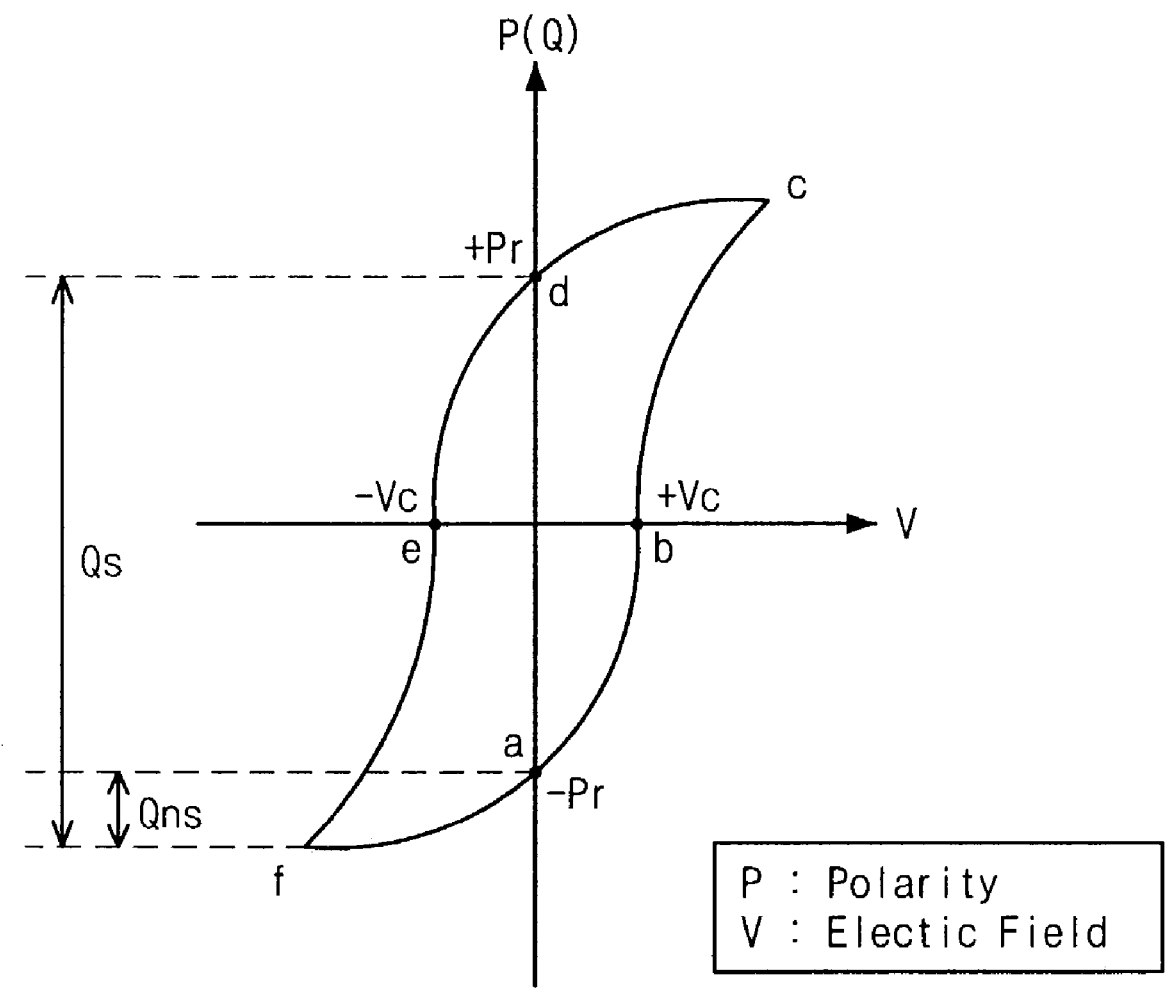
FIG. 1 is a characteristic curve showing a hysteresis loop of a general ferroelectric material.
Figure 2:
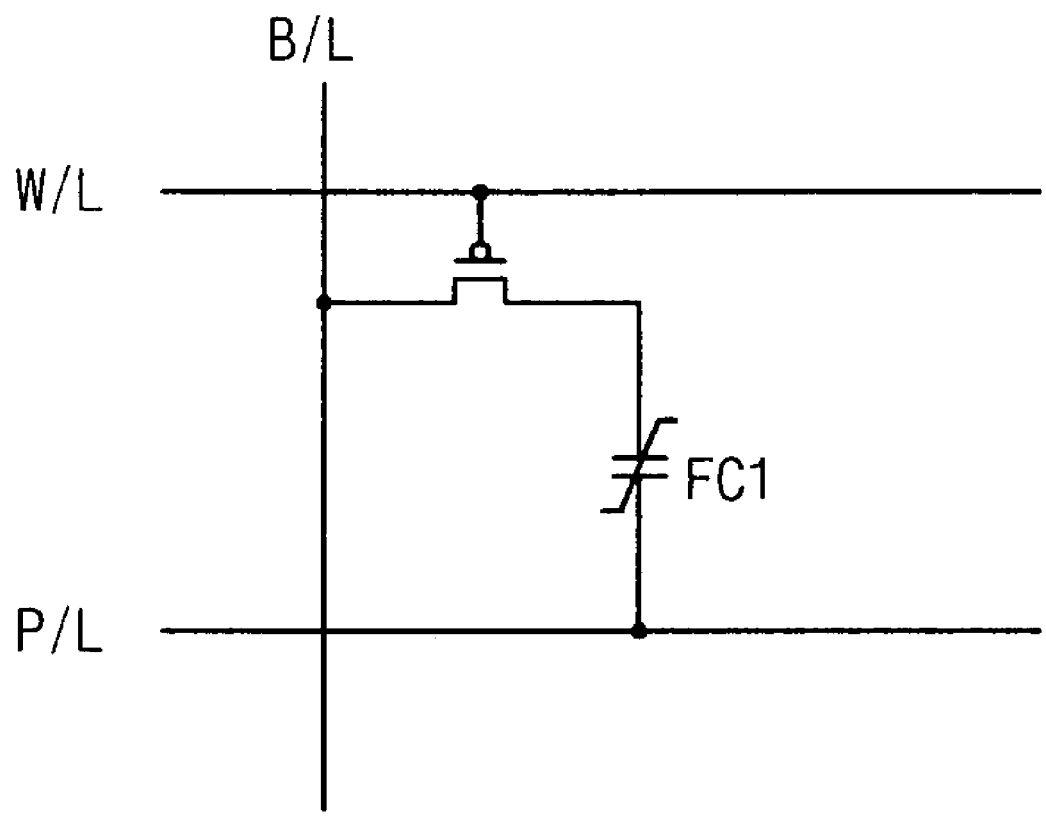
FIG. 2 is a structural diagram showing a unit cell in a general nonvolatile ferroelectric memory device.
Figure 3A:
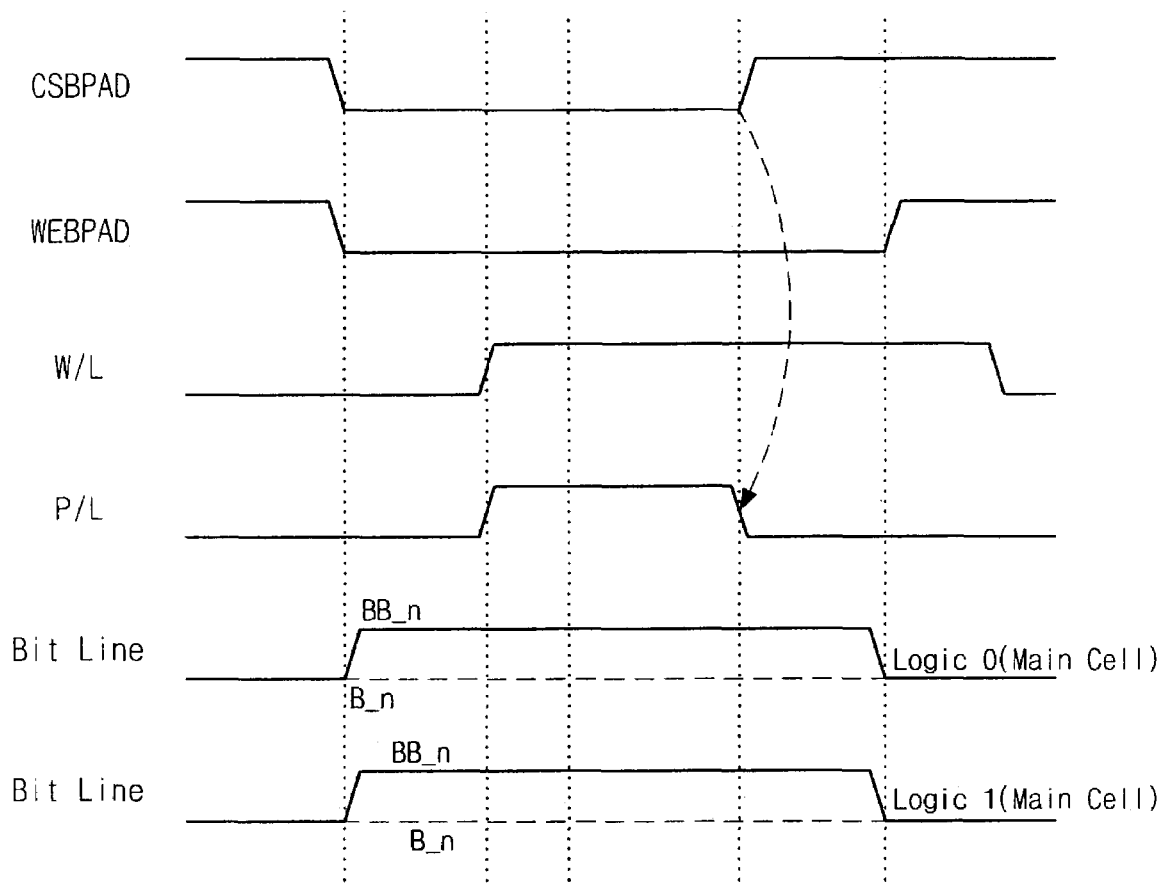
FIG. 3a is a timing diagram showing a write mode operation of a general nonvolatile ferroelectric memory device.
Figure 3B:
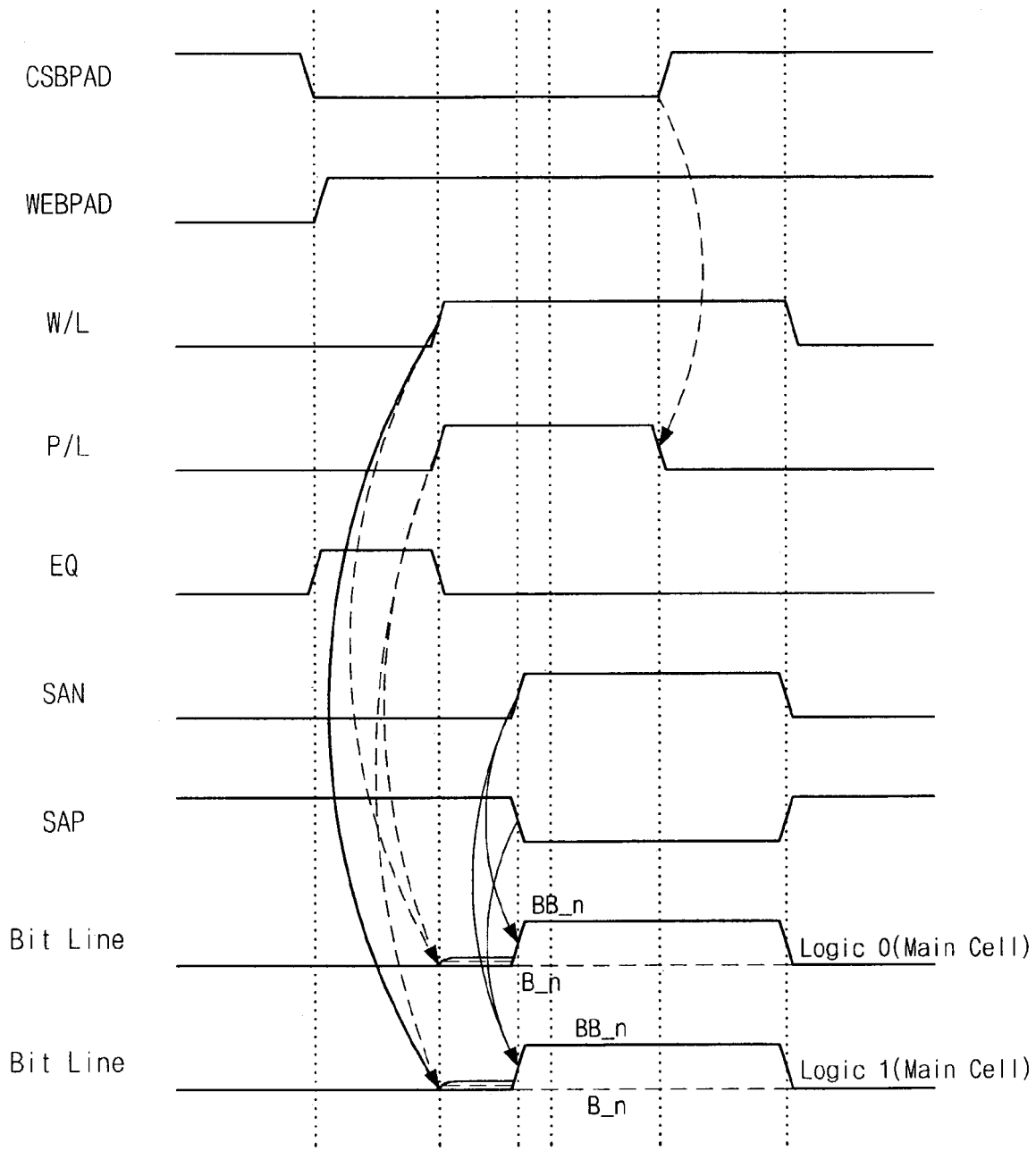
FIG. 3b is a timing diagram showing a read mode operation of a general nonvolatile ferroelectric memory device.
Figure 4:
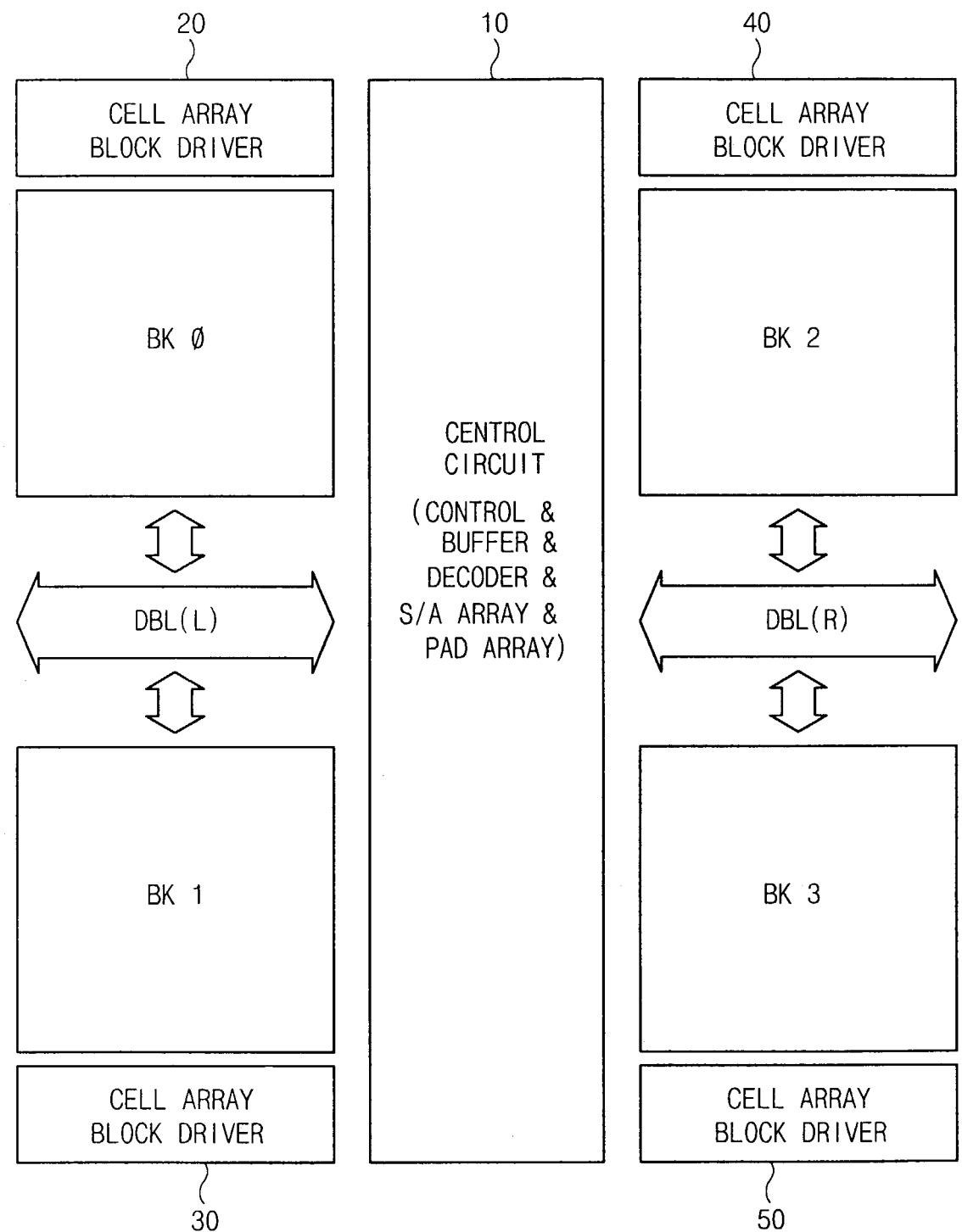
FIG. 4 is a structural diagram showing a nonvolatile ferroelectric memory device in accordance with a first preferred embodiment of the present invention.

FIG. 4 is a structural diagram showing a nonvolatile ferroelectric memory device in accordance with a first preferred embodiment of the present invention.

Referring to FIG. 4, the nonvolatile ferroelectric memory device of the present invention comprises four cell array blocks BK0, BK1, BK2 and BK3. Peripheral circuits 10 for controlling data read/write operation of the cell array blocks BK0–BK3 (hereinafter, referred to as 'control circuit unit') such as controller, buffer, decoder, sense amplifier array and pad array are positioned in the middle of the cell array blocks BK0–BK3. As a result, the cell array blocks are symmetrically divided into two parts BK0, BK1 and BK2, BK3 by the control circuit unit 10.

Data buses DBL(L) and DBL(R) for connecting the cell array blocks BK0–BK3 with the control circuit unit 10 are positioned between each cell array block divided by the control circuit unit 10. The data buses DBL(L) and DBL(R) are shared in the corresponding cell array blocks BK0, BK1 and BK2, BK3.

In other words, the data bus DBL(L) shared in the cell array blocks BK0 and BK1 is positioned between the cell array blocks BK0 and BK1, while the data bus DBL(R) shared in the cell array blocks BK2 and BK3 is positioned between the cell array blocks BK2 and BK3.

Cell array block drivers 20, 30, 40 and 50 for outputting driving signals driving the cell array blocks BK0–BK3 are positioned in one side of the cell array blocks BK0–BK3, respectively, parallel to the data buses DBL(L) and DBL(R).

Figure 5:
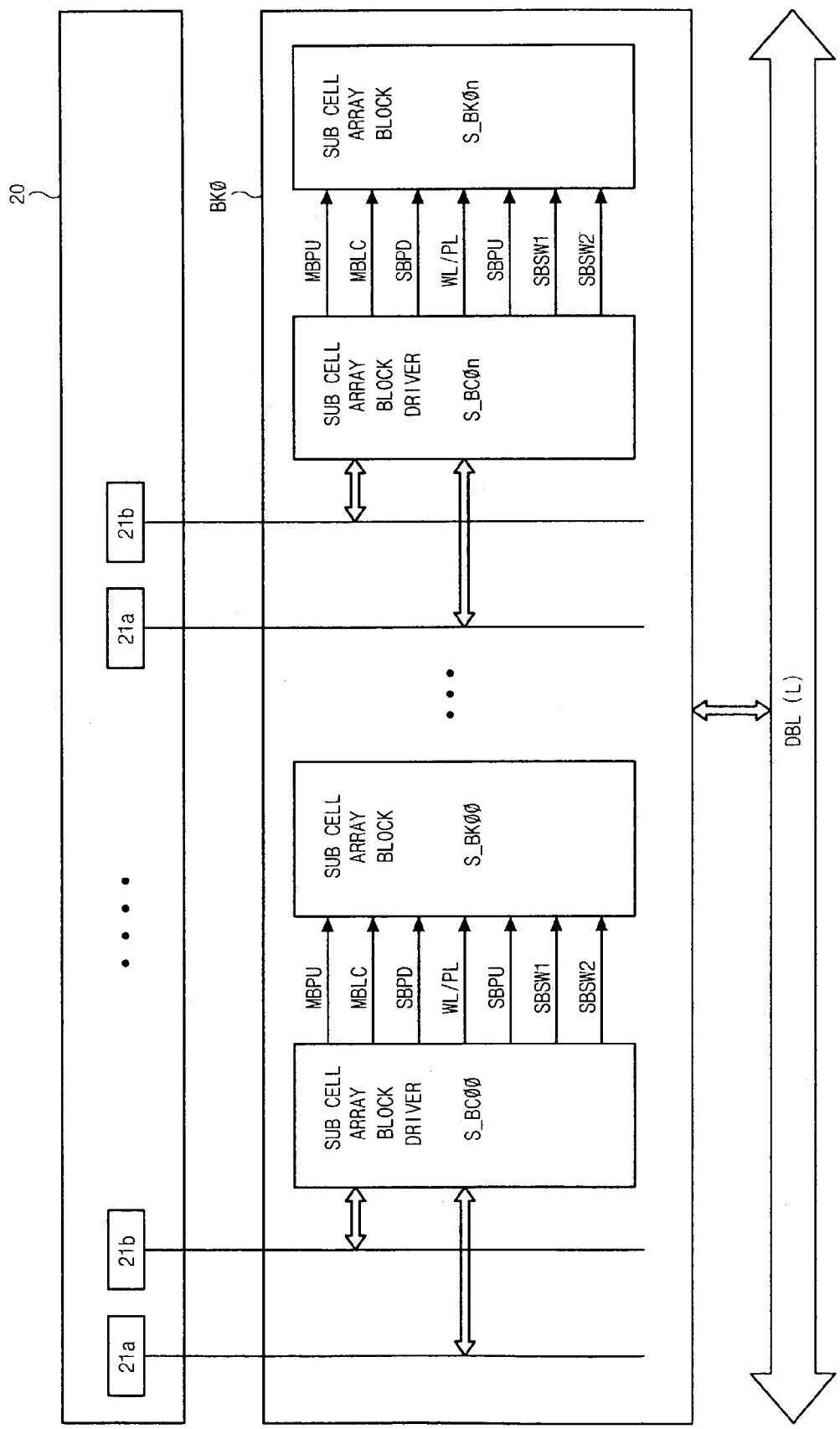
FIG. 5 is a detail diagram showing the nonvolatile ferroelectric memory device of the present invention.

FIG. 5 is a detail diagram showing the nonvolatile ferroelectric memory device of the present invention.

Because each cell array blocks BK0–BK3 have the same structure, one cell array block BK0 will be described.

The cell array block BK0 comprises a plurality of sub-cell array blocks S_BK00–S_BK0n and a plurality of sub-cell array block drivers S_BC00–S_BC0n. The plurality of sub-cell array block drivers S_BC00–S_BC0n transmits driving signals MBPU, MBLC, SBPD, SBPU, SBSW1 and SBSW2 from the cell array block driver 20 and wordline/plateline enable signals from the low address decoder (not shown) into the plurality of sub-cell array blocks S_BK00–S_BK0n.

The cell array block driver 20 comprises a plurality of sub-cell array selectors 21a and signal drivers 21b corresponding to each sub-cell array block driver S_BC00–S_BC0n. In other words, a pair of a sub-cell array selector 21a and a signal driver 21b form a sub-driver. The plurality of sub-drivers are repeatedly in the cell array block driver 20 parallel to wordlines/platelines of the cell. Signal lines where signals from the sub-cell array selector 21a and the signal driver 21b are transmitted are positioned in one side of each sub-cell array block driver S_BC00–S_BC0n parallel to bitlines B/L of the cell.

Data of the sub-cell array blocks S_BK00–S_BK0n by driving signals from the sub-cell array block driver S_BC00–S_BC0n are selectively transmitted into the data bus DBL(L).

Figure 6:
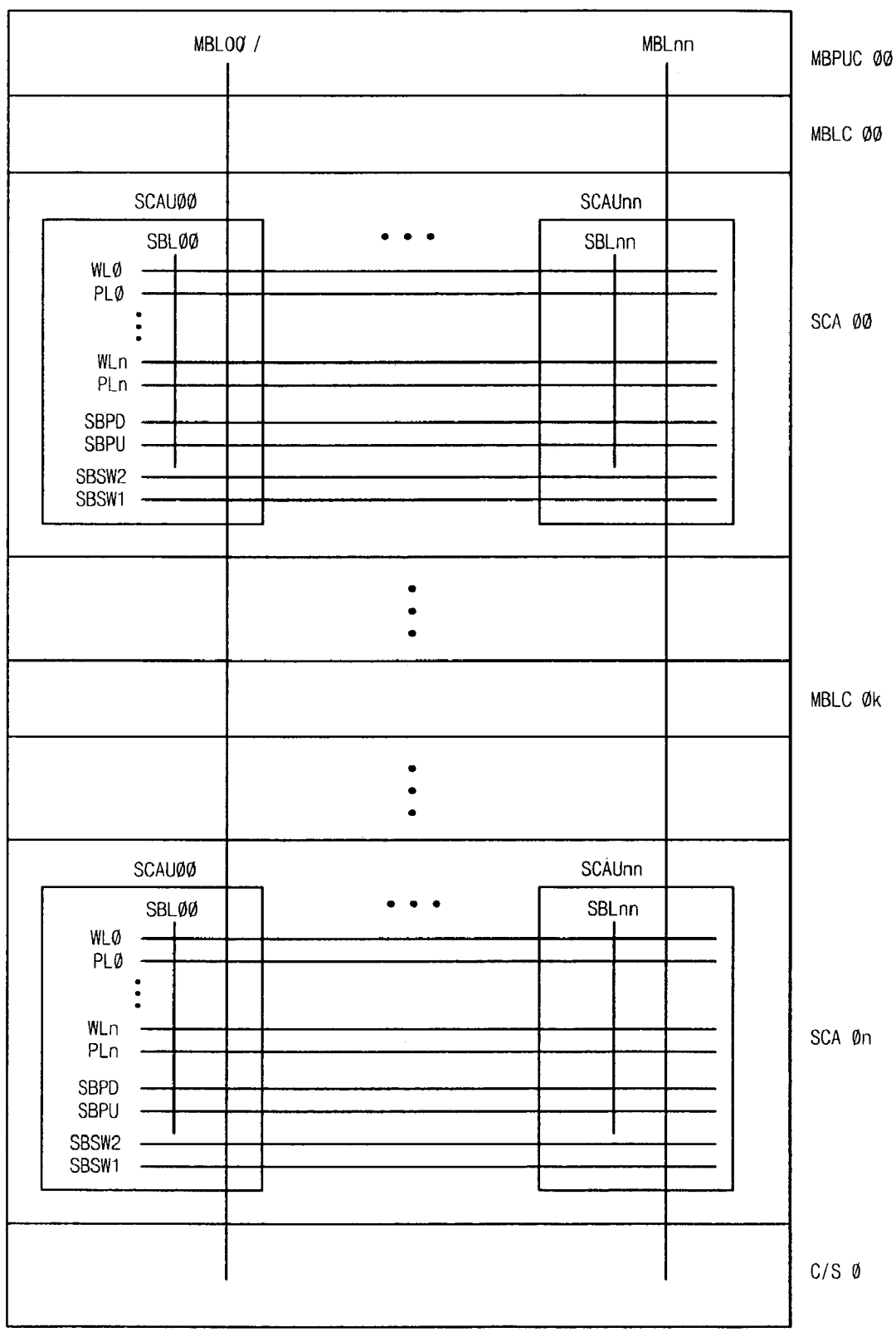
FIG. 6 is a detail diagram showing a sub-cell array block of the present invention.

FIG. 6 is a detail diagram showing the sub-cell array block S_BK00 of the present invention.

The sub-cell array block S_BK00 comprises a main bitline pull-up controller MBPUC00, a plurality of main bitline load controller MBLC00–MBLC0k, a plurality of sub-cell arrays SCA00–SCA0n (n>k) corresponding to main bitline load controllers MBLC00–MBLC0k and a column selection unit C/S0.

In other words, one main bitline load controller MBLC00 corresponds to the plurality of sub-cell arrays SCA00–SCA0m (m<n). A plurality of bitlines MBL00–MBLnn shared in the main bitline pull-up controller MBPUC00, the main bitline load controllers MBLC00–MBLC0k, the sub-cell arrays SCA00–SCA0n and the column selection unit C/S0 are arranged in the sub-cell array block S_BK00. The plurality of bitlines MBL00–MBLnn are selectively connected to the data bus DBL(L) by the column selection unit C/S0.

The main bitline pull-up controller MBPUC00 pulls up voltages of the main bitlines MBL00–MBLnn before read/write modes. The main bitline load controllers MBLC00–MBLC0k supply current to the main bitlines MBL00–MBLnn when data of the main bitlines MBL00–MBLnn are sensed, thereby applying load to the main bitlines MBL00–MBLnn.

The sub-cell arrays SCA00–SCA0n comprises sub-bitlines SBL00–SBLnn corresponding to the main bitlines MBL00–MBLnn and a plurality of sub-cell array units SCAU000–SCAU0nn including nonvolatile ferroelectric memory cells connected to the sub-bitlines SBL00–SBLnn. In the sub-cell arrays SCA00–SCA0n, wordlines WL0–WLn, platelines PL0–PLn, sub-bitline pull-down and pull-up lines SBPD and SBPU and sub-bitline switch lines SBSW1 and SBSW2 are arranged vertical to subbitlines SBL00–SBLnn shared in the sub-cell array units SCAU00–SCAUnn.

Figure 7:
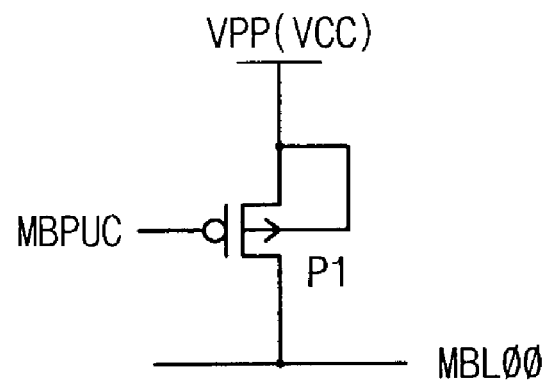
FIG. 7 is a circuit diagram showing a main bitline pull-up controller.
Figure 8:
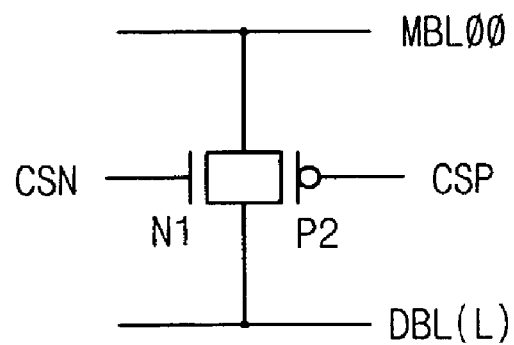
FIG. 8 is a circuit diagram showing a column selection unit.
Figure 9:
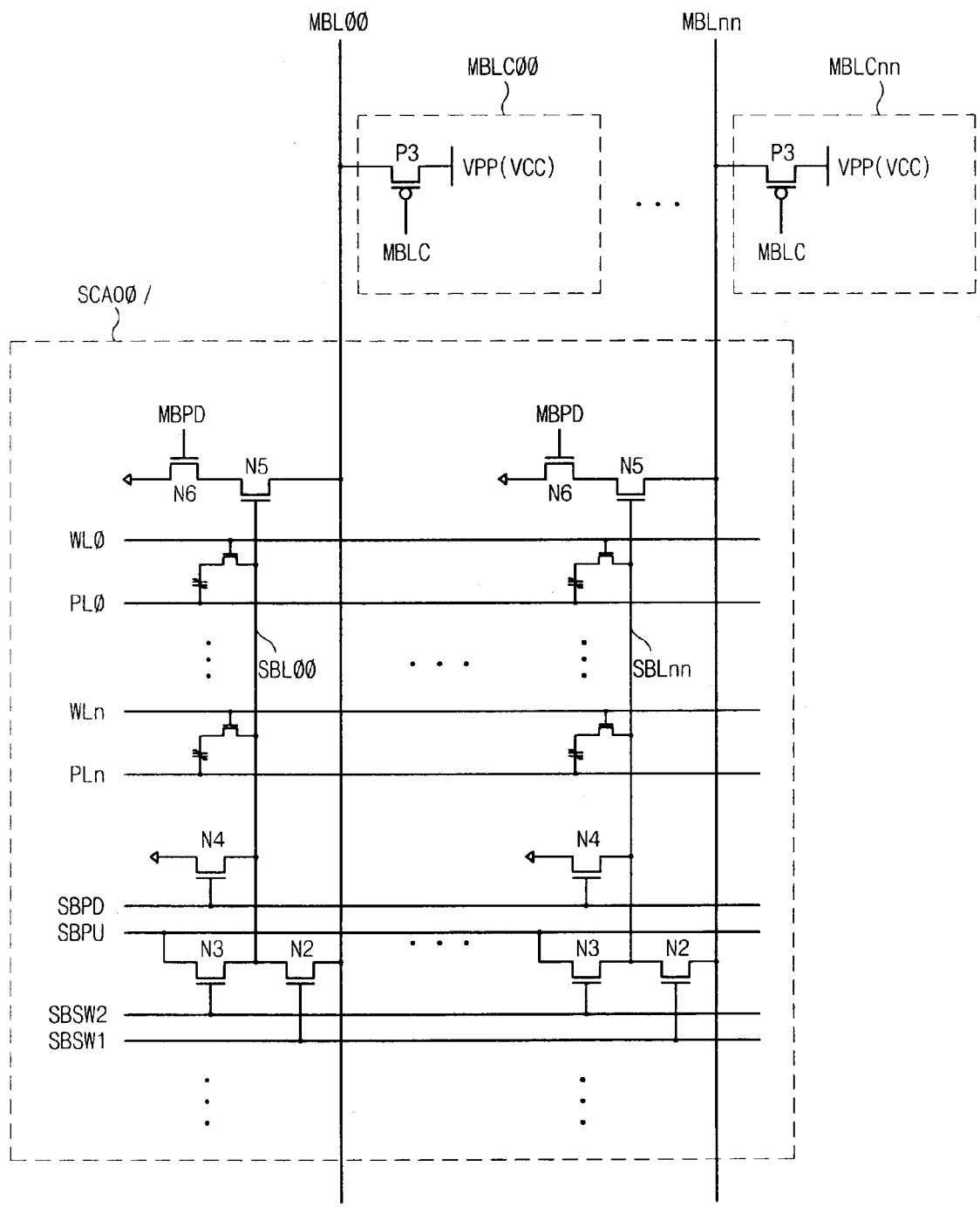
FIG. 9 is a circuit diagram showing a main bitline load controller and its corresponding sub-cell array.

FIGS. 7 to 9 are circuit diagrams showing the detailed structure of the cell array block BK0.

FIG. 7 is a circuit diagram showing a main bitline pull-up controller.

The main bitline pull-up controller MBPUC00 comprises PMOS transistors P1 connected between one of the main bitlines MBL00–MBLnn and a power voltage VPP(VCC). The PMOS transistors P1 supplies the power voltage VPP(VCC) to one of the main bitlines MBL00–MBLnn at a precharge according to the pull-up control signal MBPUC applied to the gate of the PMOS transistor.

FIG. 8 is a circuit diagram showing the column selection unit.

The column selection unit C/S0 comprises pairs of a NMOS transistor N1 and a PMOS transistor P2 connected in parallel between one of the bitlines MBL00–MBLnn and the data bus DBL(L). The pairs of the NMOS transistor N1 and the PMOS transistor P2 selectively connect one of the main bitlines MBL00–MBLnn to the data bus DBL(L) according to column selection signals CSN and CSP applied to each gate.

The data transmitted into the data bus DBL(L) is transmitted into a sense amplifier of the control circuit 10, and the data is then sensed and amplified.

FIG. 9 is a circuit diagram showing the main bitline load controller MBLC00 and its corresponding sub-cell array SCA00 among the sub-cell arrays SCA00–SCA0m.

The main bitline load controller MBLC00 comprises a PMOS transistors P3 connected between one of the main bitline MBL00–MBLnn and a power voltage VPP(VCC). The PMOS transistor P3 loads the main bitlines MBL00–MBLnn by supplying the power voltage VPP(VCC) to the main bitlines MBL00–MBLnn according to the load control signal MBLC applied to the gate of the PMOS transistor P3.

The sub-cell array SCA00 comprises a plurality of sub-cell array units SCAU000–SCAU00n having the same structure.

The sub-cell array unit SCAU00 includes NMOS transistors N2, N3 and N4. The NMOS transistor N2 connected between the main bitline MBL00 and the sub-bitline SBL00 has a gate connected to the sub-bitline selection switch line SBSW1. The NMOS transistor N3 connected between the sub-bitline SBL00 and the sub-bitline pull-up line SBPU has a gate connected to the sub-bitline selection switch line SBSW2. The NMOS transistor N4 connected between the sub-bitline SBL00 and a ground voltage has a gate connected to the sub-bitline pull-down line SBPU.

The sub-cell array unit SCAU00 also comprises a plurality of unit cells including NMOS transistors. The NMOS transistors connected between the sub-bitline SBL00 and ferroelectric capacitors connected to the platelines PL0-PLn have a gate connected to the wordlines WL0–WLn, respectively.

Additionally, the sub-cell array unit SCAU00 comprises NMOS transistors N5 and N6. The NMOS transistors N5 and N6 connected in series between the main bitline MBL00 and the ground voltage have their gates connected to the sub-bitline SBL00 and the main bitline pull-down signal MBPD, respectively.

Figure 10:
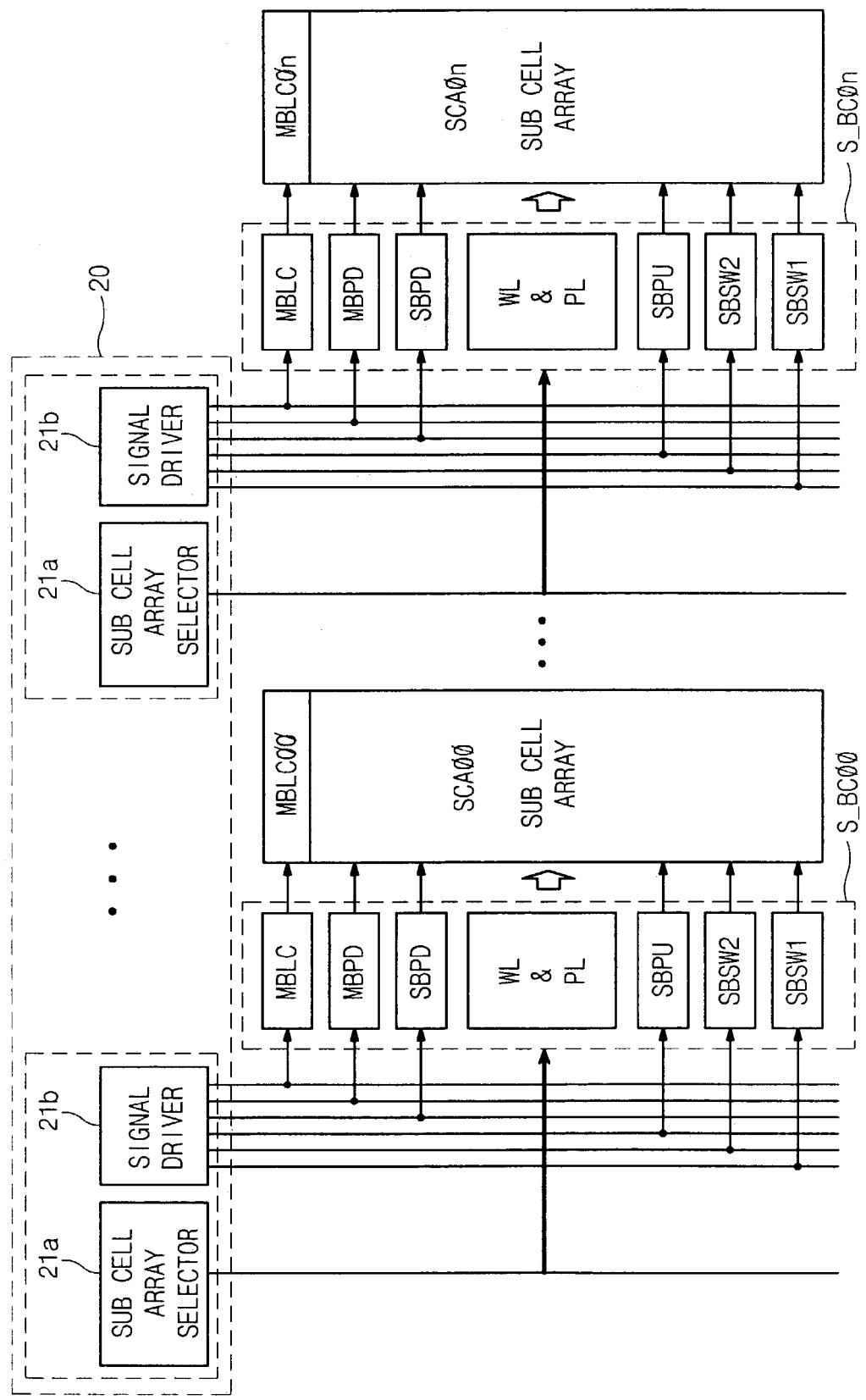
FIG. 10 is a detail diagram showing a line structure of the cell array block driver and the cell array block in accordance with the first preferred embodiment.

FIG. 10 is a detail diagram showing a line structure of the cell array block driver 20 and the cell array block BK0 in accordance with the first preferred embodiment.

In this preferred embodiment, only the line structure of the main bitline load controller MBLC and corresponding to a sub-cell array SCA00 is illustrated.

The sub-cell array selectors 21a and the signal drivers 21b are arranged in one side of the cell array block BK0 parallel to wordlines/platelines WL/PL. Signal lines (hereinafter, referred to 'first signal line') connected to the sub-cell array selectors 21a and the signal drivers 21b and transmitting driving signals are arranged in one side of the sub-cell array block drivers S_BC00–S_BC0n parallel to the bitlines MBL (SBL).

The first signal lines corresponding to each sub-cell array block S_BK00–S_BK0n are shared in the sub-cell array blocks S_BK00–S_BK0n, respectively. Signal lines (hereinafter, referred to as 'second signal line') for transmitting the driving signals from the first signal lines into the sub-cell array block drivers S_BC00–S_BC0n are arranged parallel to wordlines/platelines WL/PL.

Figure 11:
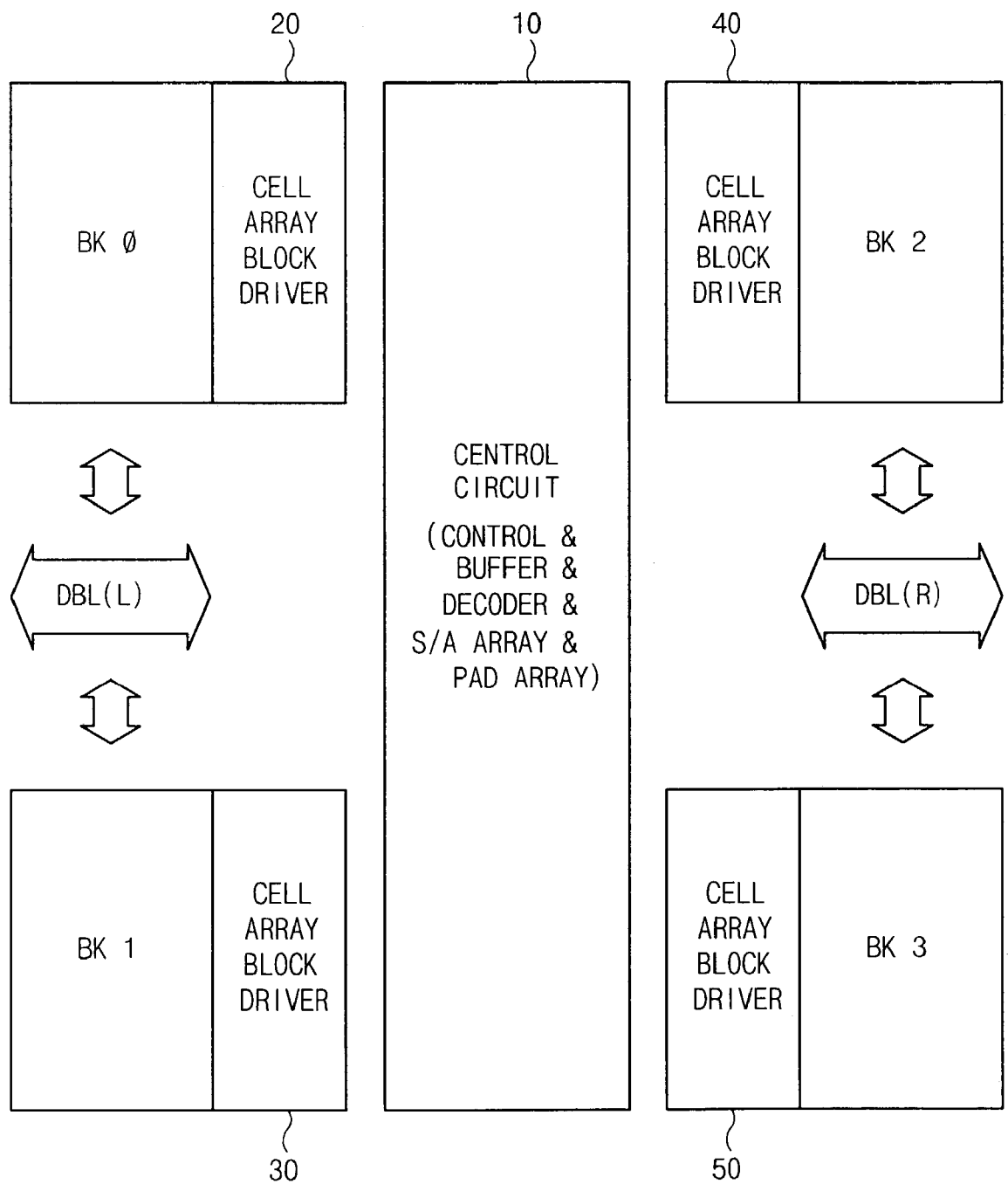
FIG. 11 is a structural diagram showing a nonvolatile ferroelectric memory device in accordance with a second preferred embodiment of the present invention.

FIG. 11 is a structural diagram showing a nonvolatile ferroelectric memory device in accordance with a second preferred embodiment of the present invention.

The nonvolatile ferroelectric memory device of the second preferred embodiment is different from that of the above-described first preferred embodiment in the position of cell array block drivers 20, 30, 40 and 50. In this preferred embodiment, the cell array block drivers 20, 30, 40 and 50 are arranged in one side of cell array blocks BK0–BK3 parallel to bitlines MBL(SBL).

Figure 12:
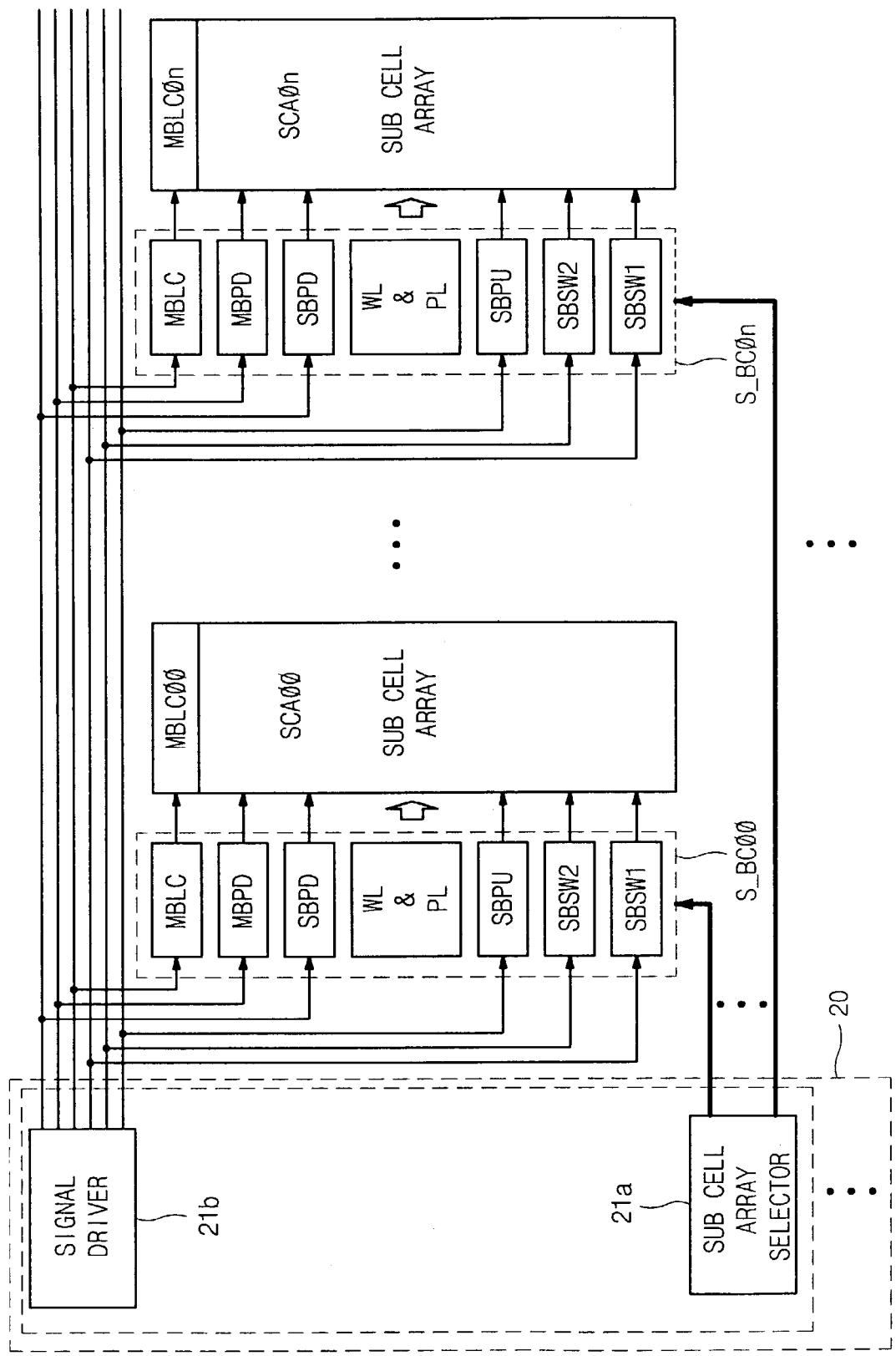
FIG. 12 detail diagram showing the cell array block driver and a line structure of the cell array block in accordance with the second preferred embodiment.

FIG. 12 detail diagram showing a line structure of the cell array block driver 20 and the cell array block in accordance with the second preferred embodiment.

In this preferred embodiment, a plurality of pairs of sub-cell array selectors 21a and signal drivers 21b are repeatedly arranged in one sides of the cell array blocks BK0–BK3 parallel to the bitlines MBL(SBL).

Because the sub cell array selectors 21a and the signal drivers 21b are arranged parallel to the bitlines MBL(SBL), unlike the first preferred embodiment, first signal lines are arranged parallel to wordlines/platelines WL/PL and shared in all sub-cell array blocks S_BK00–S_BK0n in order to apply driving signals to each sub-cell array block S_BK00–S_BK0n. Second signal lines are arranged parallel to bitlines MBL(SBL) in order to apply driving signals from the first signal lines to sub-cell array block drivers S_BC00–S_BC0n.

Here, each driver of the sub-cell array drivers S_BC00–S_BC0n for transmitting signals from the signal drivers 21b into the sub-cell array block S_BK00 comprises a transmission gate controlled by output signals of the sub-cell array selectors 21a.

However, in the cell array block driver 20 for driving the cell array blocks BK0–Bk3 according to the above-described first and second preferred embodiments, a plurality of the same sub-cell array selectors 21a and signal drivers 21b are repeatedly used. The repeated use thereof increases according to high integration of chips.

Due to the repeated use, the area for the first and the second signal lines occupies much space as the chips are highly integrated. As a result, the layout area of the chips are generally increased.

Accordingly, in order to reduce the layout area of the chip, the multi-layer structure is used. In the multi-layer structure, the repeatedly used first and second signal lines are passed above the sub-cell array blocks S_BK00–S_BK0n or the sub-cell array block drivers S_BC00–S_BC0n.

In other words, a layer where the first and second signal lines are formed is positioned above a layer where the sub-cell array blocks S_BK00–S_BK0n or the sub-cell array block drivers S_BC00–S_BC0n.

Figure 13:
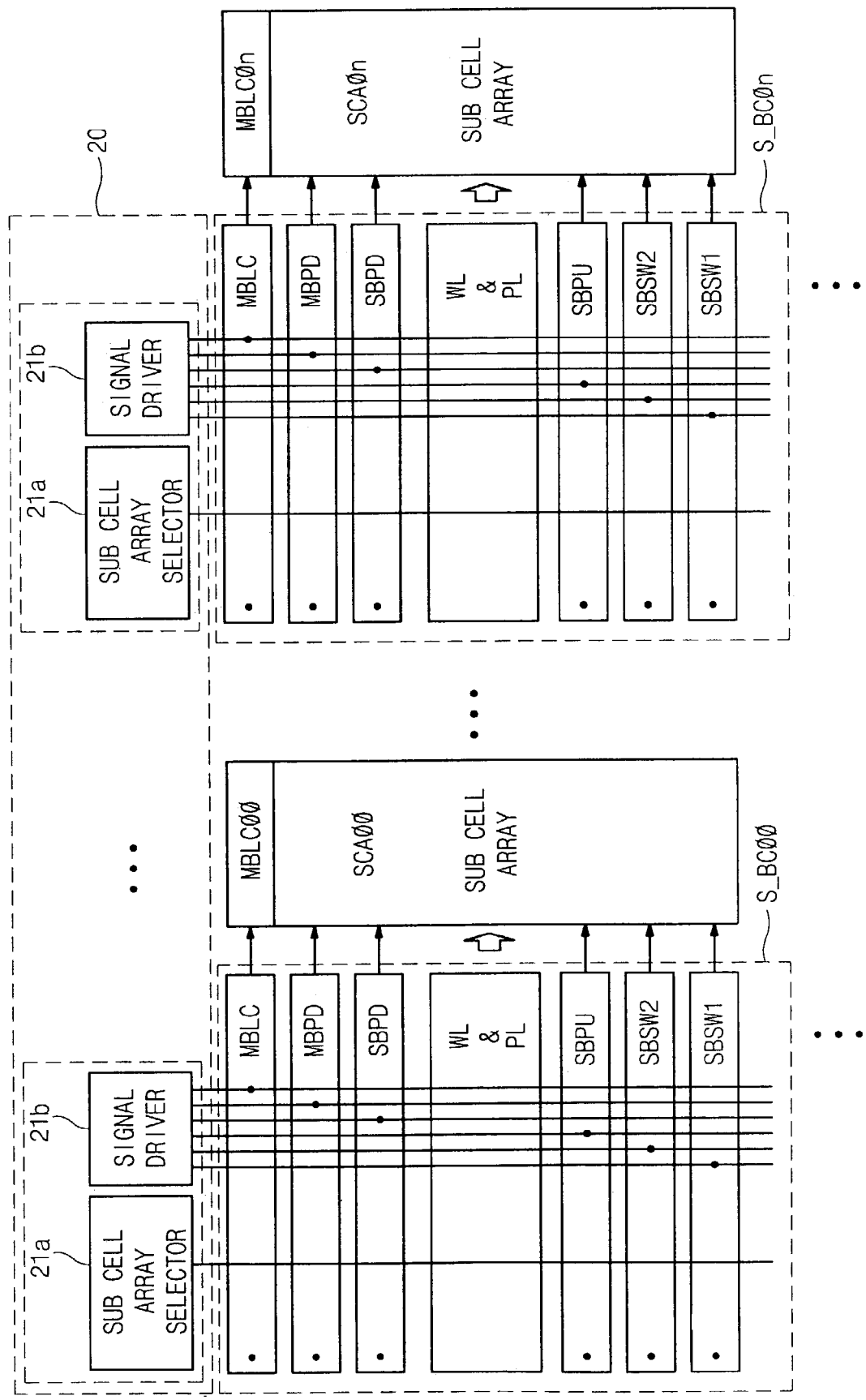
FIG. 13 is a diagram showing the nonvolatile ferroelectric memory device having a multi-layer structure in accordance with the first preferred embodiment.

FIG. 13 is a diagram showing the nonvolatile ferroelectric memory device having the multi-layer structure in accordance with the first preferred embodiment.

As shown in FIG. 13, the multi-layer is illustrated wherein the first signal lines are passed above the cell-array block drivers S_BC00–S_BC0n. However, the first signal lines may be passed above the sub-cell array blocks S_BK00–S_BK0n in the multi-layer structure.

In this way, the multi-layer structure does not need the conventional area wherein the first signal lines are arranged. Accordingly, although the same pair of sub-cell array selectors 21a and signal drivers 21b are repeatedly used, an additional layout area for arranging the first signal lines is not required.

Figure 14:
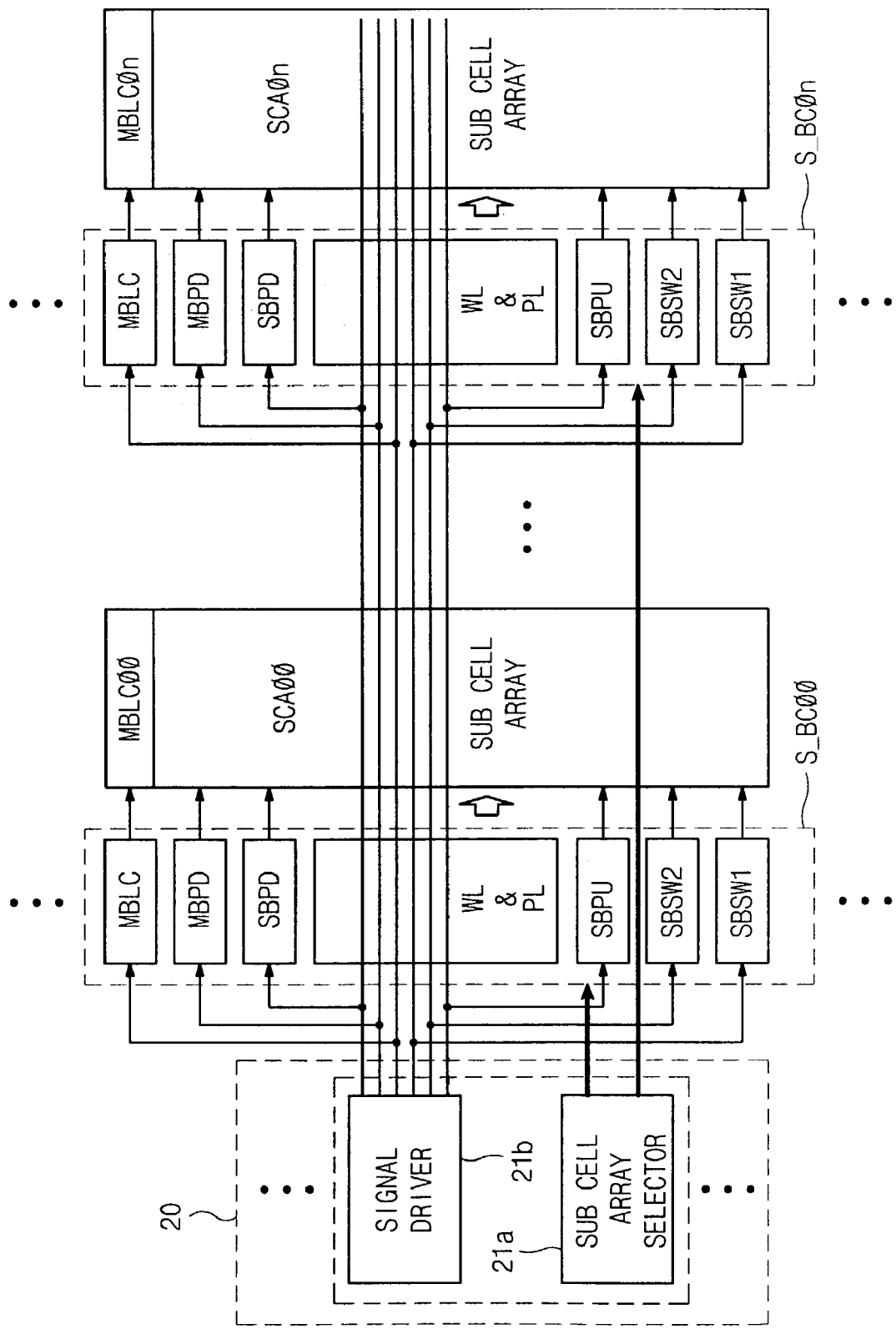
FIG. 14 is a diagram showing the nonvolatile ferroelectric memory device having a multi-layer structure in accordance with the second preferred embodiment.

FIG. 14 is a diagram showing the nonvolatile ferroelectric memory device having the multi-layer structure in accordance with the second preferred embodiment.

In this preferred embodiment, the first signal lines are passed above the sub-cell array block drivers S_BC00–S_BC0n and the sub-cell array blocks S_Bk00–S_BK0n parallel to wordlines/platelines WL/PL.

For this arrangement, the first signal lines are formed on insulating layers above the layers where the sub-cell array block drivers S_BC00–S_BC0n and the sub-cell array blocks S_BK00–S_Bk0n are formed.

The second signal lines are also formed on the same layer with the first signal lines. However, in this preferred embodiment, the multi-layer structure further comprises an intermediate layer where interconnect lines for connecting different layers electrically are formed, as shown in FIG. 15.

Figure 15:
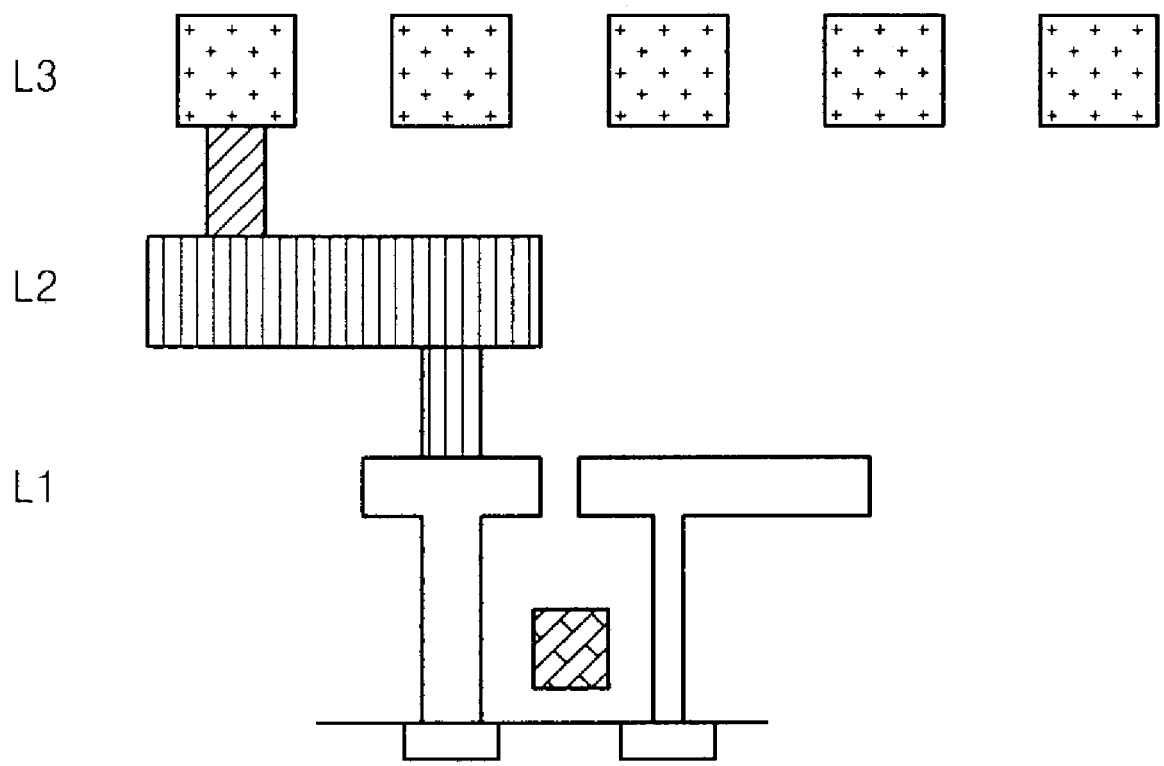
FIG. 15 is a cross-sectional diagram showing a cross-section of the chip having the multi-metal layer according to the present invention.

FIG. 15 is a cross-sectional diagram showing a cross-section of the chip having the multi-metal layer structure according to the present invention.

The layer L1 is a layer where the sub-cell array blocks S_BK00–S_BK0n or the sub-cell array block driver S_BC00 are formed. The layer L3 is a layer where the first and the second signal lines are formed.

The layer L2 is an intermediate layer where interconnect lines for connecting the layer L1 to the layer L3 are formed.

It is obvious that the intermediate layer such as the layer L2 may be plural.

As discussed earlier, the nonvolatile ferroelectric memory device of the present invention can optimally regulate delay elements of signals by effectively reducing the cell array and core-related layout area. Particularly, the nonvolatile ferroelectric memory device of the present invention can reduce the size of chips by using the multi-layers a layer.

What is claimed is:

1. A nonvolatile ferroelectric memory device comprising:
   a plurality of cell array blocks each having a plurality of cell arrays and including sub-bitlines and main bitlines in which a sensing voltage of sub-bitlines is transformed into a current to induce a sensing voltage of main bitlines;
   a cell array block driver for transmitting driving signals to drive the cell array blocks;
   a control circuit unit for controlling data read/write operation of the plurality of cell array blocks wherein the control circuit unit is arranged to symmetrically divide the plurality of cell array blocks; and
   a plurality of data buses shared in the main bitlines by using switching devices and arranged vertically in both sides of the control circuit unit.

2. The device according to claim 1, wherein the cell array block driver is arranged in the outside of the cell array block parallel to the control circuit unit.

3. The device according to claim 2, wherein driving signal lines transmitting the driving signals are arranged vertical to the bitlines.

4. The device according to claim 3, wherein a layer where the driving signal lines are formed is positioned above a layer where the cell array blocks are formed.

5. The device according to claim 1, wherein the cell array block driver is arranged in the outside of the cell array block parallel to the data bus.

6. The device according to claim 5, wherein the driving signal lines transmitting the driving signals are arranged parallel to the bitlines.

7. The device according to claim 6, wherein a layer where the driving signal lines are formed is positioned above a layer where the cell array blocks are formed.

8. The device according to claim 1, wherein the control circuit comprises a controller, a buffer, a decoder, a sense amplifier and a pad array.

9. A nonvolatile ferroelectric memory device comprising:
   a plurality of cell array blocks each having a plurality of cell arrays and including sub-bitlines and main bitlines in which a sensing voltage of sub-bitlines is transformed into a current to induce a sensing voltage of main bitlines;
   a control circuit unit for and controlling data read/write operation of the cell array blocks wherein the control circuit unit is arranged to symmetrically divide the plurality of cell array blocks;
   a plurality of data buses shared in the main bitlines by using switching devices and arranged vertically in both sides of the control circuit unit; and
   a cell array block driver, arranged in the outside of the cell array block parallel to the data buses, for transmitting driving signals to drive the plurality of cell array blocks.

10. The device according to claim 9, wherein the driving signal lines transmitting the driving signals are arranged parallel to the bitlines.

11. The device according to claim 10, wherein a layer where the driving signal lines are formed is positioned above a layer where the cell array blocks are formed.

12. The device according to claim 9, wherein the control circuit comprises a controller, a buffer, a decoder, a sense amplifier and a pad array.

13. A nonvolatile ferroelectric memory device comprising:
   a plurality of cell array blocks each having a plurality of cell arrays and including sub-bitlines and main bitlines in which a sensing voltage of sub-bitlines is transformed into a current to induce a sensing voltage of main bitlines;

a control circuit unit for controlling data read/write operation of the cell array blocks wherein the control circuit unit is arranged to symmetrically divide the plurality of cell array blocks;

a plurality of data buses shared in the main bitlines by using switching devices and arranged vertically in both sides of the control circuit unit; and a cell array block driver, arranged in the outside of the cell array block parallel to the control circuit unit, for transmitting driving signals to drive the plurality of cell array blocks.

14. The device according to claim 13, wherein driving signal lines transmitting the driving signals are arranged vertical to the bitlines.

15. The device according to claim 14, wherein a layer where the driving signal lines are formed is positioned above a layer where the cell array blocks are formed.

16. The device according to claim 13, wherein the control circuit unit comprises a controller, a buffer, a decoder, a sense amplifier and a pad array.

* * * * *